United States Patent [19]

Ma et al.

[11] Patent Number: 5,060,297
[45] Date of Patent: Oct. 22, 1991

[54] TVRO RECEIVER SYSTEM WITH TRACKING FILTER FOR REJECTION OF IMAGE FREQUENCIES

[76] Inventors: John Y. Ma, 499 Dundee Ave., Milpitas, Calif. 90535; Bonnie Houston, 19301 Bear Creek Rd., Los Gatos, Calif. 95035

[21] Appl. No.: 176,844

[22] Filed: Apr. 4, 1988

[51] Int. Cl.$^5$ .............................................. H04B 1/10
[52] U.S. Cl. ................................... 455/302; 455/306; 455/311; 455/315; 455/207; 455/307
[58] Field of Search ............... 455/195, 302, 264, 307, 455/260, 306, 311, 317, 315, 189, 190, 196, 197, 207, 316; 333/178, 172

[56] References Cited

U.S. PATENT DOCUMENTS

| | | | |
|---|---|---|---|
| 3,588,706 | 6/1971 | Sakai et al. | 455/195 |
| 4,053,834 | 10/1977 | Lerner | 455/63 |
| 4,241,450 | 12/1980 | Blatter et al. | 455/260 |
| 4,281,348 | 7/1981 | Shizuya | 455/307 |
| 4,419,768 | 12/1983 | Yamashita et al. | 455/315 X |
| 4,521,916 | 6/1985 | Wine | 455/182 |
| 4,556,988 | 12/1985 | Yoshisato | 455/302 |
| 4,662,001 | 4/1987 | Cruz et al. | 455/302 |
| 4,718,117 | 1/1988 | Ma et al. | 455/307 X |
| 4,761,825 | 8/1988 | Ma | 455/186 X |
| 4,792,993 | 12/1988 | Ma | 455/266 |
| 4,876,739 | 10/1989 | Ma et al. | 455/307 X |

Primary Examiner—Douglas W. Olms
Assistant Examiner—Ralph Smith
Attorney, Agent, or Firm—Kareem M. Irfan

[57] ABSTRACT

A TVRO receiver for the reception of frequency modulated satellite broadcast signals is provided with the capability of efficiently rejecting image frequencies generated as the received signals undergo intermediate frequency translation. A TVRO tuner, which includes a super-heterodyne circuit having a voltage-controlled oscillator (VCO), means for supplying a controlling tuning voltage to the VCO, and a mixer for combining incoming 1st IF signals with the output frequency of the VCO to reduce the frequency of the 1st IF signals to a selected 2nd IF frequency, is provided with a tracking filter which is adapted to pass only the incoming 1st IF signals and effectively reject any image frequencies generated at the received signal frequencies. The tracking filter comprises at least one low-pass filter section and has a cut-off frequency which is controlled by the same tuning voltage used to regulate the output frequency of the VCO in such a way that the filter rejects frequencies exceeding the VCO output frequency. The filter is designed so that image frequencies, which are generated during the intermediate frequency translation stage as the sum of a given VCO output frequency and the selected 2nd IF frequency, fall substantially beyond the filter cut-off frequency and are thereby attenuated. The tracking filter allows adequate rejection of image frequencies without need for accurate tuning of the low-pass filter sections or precisely matched variable capacitance devices.

17 Claims, 4 Drawing Sheets

FIG.1

PRIOR ART

TVRO RECEIVER SYSTEM WITH TRACKING FILTER FOR REJECTION OF IMAGE FREQUENCIES

BACKGROUND OF THE INVENTION

1. Field of the Invention

The present invention relates generally to receivers for TVRO earth stations capable of receiving audio and video signals from a plurality of orbiting earth satellites. More particularly, this invention relates to a TVRO receiver system which includes a tracking filter arrangement capable of adequately rejecting image frequencies generated by received signals.

2. Description of Related Art

In satellite communication systems, orbiting satellites are used to receive modulated carriers transmitted in the form of electromagnetic waves from a transmitting earth station. The satellites retransmit the incident electromagnetic waves, after they have been electronically reformatted in some fashion, to receiving earth stations. The earth stations in such systems generally comprise transmitting and/or receiving power stations which function in conjunction with an antenna subsystem. TVRO earth stations in particular are adapted to receive such satellite broadcast signals and generally comprise a receiving antenna such as a paraboloidal dish, a low noise block converter located at an outer antenna site, and a superheterodyne receiver located in the vicinity of a television set adapted to display received signals.

Satellite signals received by the antenna are first converted to a lower IF frequency. The conversion is generally effected by a down converter which transforms a single selected channel to a first IF frequency, or a block converter which converts all channels possessing a common polarity to a first IF block of frequencies typically ranging from 950 to 1450 MHz. The down-converted block of frequencies is passed to the receiver end through a coaxial cable and the receiver converts the first IF signals to a second IF frequency range which traditionally has been centered at about 70 MHz in most TVRO systems. State-of-the-art TVRO receivers are increasingly using higher second IF frequencies, e.g., 612 MHz, in order to ensure that frequencies provided by the local oscillator stage are above the first IF block of frequencies and thereby prevent local oscillator frequencies from interfering with received signals.

Regardless of the actual second IF frequency being used in a TVRO system, a basic problem associated with the reception of satellite signals in such systems is the existence of image frequencies generated as a function of the local VCO frequency and the desired IF frequency. More specifically, in TVRO receivers, the second IF frequency represents the preselected constant difference frequency between the first IF center frequency and the corresponding VCO output frequency for each transponder signal. In effect, the VCO output frequencies are regulated in such a way that the second IF frequency is centered on the corresponding first IF center frequency for signals received from each transponder. For example, a VCO output frequency of 1430 MHz causes the 612-MHz second IF to be centered on the 818 MHz first IF center frequency for signals being received from a transponder. As a result, signals corresponding to the 818 MHz IF frequency are selected for reception. However, an image frequency corresponding to the sum of the VCO frequency and the desired IF frequency is also generated and constitutes noise which can severely distort the desired signals unless rejected by the receiver in some fashion. In the above example for instance, an image frequency is generated at 2042 MHz sum of the VCO frequency, i.e., 1430 MHz, and the desired IF frequency, i.e., 612 MHz). Accordingly, it is important that this image frequency of 2042 MHz be rejected in order that the desired signal at 818 MHz be adequately received.

It has been conventional to achieve the rejection of image frequencies by the use of bandpass filters. Such filters are designed to provide a high degree of rejection at the image frequencies. The use of a bandpass filter to achieve attenuation of image frequencies entails a number of disadvantages arising from the tilt or slope in the response of the bandpass filter unless it is accurately and exactly tuned onto the received frequency. The quality factor of the bandpass filter has to be substantially high in order to achieve a given amount of rejection at the image frequency. Another problem peculiar to the reception of satellite signals which generally include wide-band FM signals, is that the edges of the modulation bandwidth can vary substantially; accordingly, the bandpass filter must be tracked in such a manner that it is tuned to the center of the desired frequency band. This can only be achieved by accurate tuning and matching of the variable capacitance diodes used to define the changing passband of the bandpass filter. As a result, bandpass filters for frequency rejection in TVRO receivers are expensive since the need for precisely matched and accurately tunable varactor diodes increases both component cost and production time.

This problem is further compounded when a TVRO system is to be designed for operation with significantly different second IF frequencies. More specifically, the second IF frequencies typically used in Europe are substantially lower than the 612 MHz IF being used in other parts of the world. For instance, a commonly used IF frequency in Germany is 480 MHz. In order for a bandpass filter to function effectively in rejecting image frequencies generated by use of both the 612-MHZ and the 480-MHz IF frequencies, the quality factor of the bandpass filter must be extremely high, and the tracking and tuning of the filter components also must be correspondingly more accurate. In combination with the need for precisely matched varactor diodes, this renders the use of bandpass filters for rejection of image frequencies at different, high, IF frequencies a problematic and expensive approach.

SUMMARY OF THE INVENTION

It is a primary object of the present invention to provide an improved TVRO receiver capable of receiving satellite broadcast FM signals while rejecting image frequencies corresponding to locally generated VCO frequencies and a selected second IF frequency.

A related object is to provide a TVRO receiver system with an improved image-frequency rejection filter which can be manufactured and operated at a relatively low cost.

Another object of this invention is to provide a TVRO receiver system of the above kind wherein image frequencies are rejected without resort to matched varactor diodes and accurate filter tuning.

Yet another object of this invention is to provide a TVRO system of the above kind which is capable of effectively rejecting image frequencies even when used with different second IF frequencies.

Other objects and advantages of the invention will be apparent from the following detailed description and the accompanying drawings.

In accordance with the present invention, a TVRO receiver is provided with a tuner including a voltage-controlled oscillator (VCO), means for supplying a controlling input voltage to the VCO, and a mixer for combining incoming first IF signals with the output of the VCO to reduce the frequency of the first IF signals to a second IF frequency which typically is sufficiently high to permit the output frequency of the VCO to be above the frequency range of the first IF signals; and a linear phase low-pass filter for passing signals in a selected frequency range while effectively blocking image frequencies generated at the received signal frequencies. The filter is designed in such a way that its cut-off frequency is several hundred megahertz higher than the desired received signal frequency and the slope of the filter rejection response is such that the undesired image frequency is located on or beyond the "roll-off" point or "skirt" of the filter response. The filter does not require matched varactor diodes, and more importantly, does not require accurate tuning and functions effectively as long as the image frequencies are kept beyond the flat passband response of the filter. The control voltage that regulates the local VCO is also used to regulate the low pass filter so that the passband range of the filter corresponds directly to the varying output frequencies of the VCO, thereby assuring rejection of image frequencies corresponding to all received frequencies.

BRIEF DESCRIPTION OF THE DRAWINGS

The invention and further objects and advantages thereof may best be understood by reference to the following description when taken in conjunction with the accompanying drawings.

DESCRIPTION OF THE PREFERRED EMBODIMENT

Although the invention will be described in connection with certain preferred embodiments, it should be understood that there is no intention that the invention be limited to the disclosed embodiment. On the contrary, it is intended that all alternatives, modifications and equivalent arrangements as may be included within the spirit and scope of the appended claims be covered as part of this invention.

Figure 1:
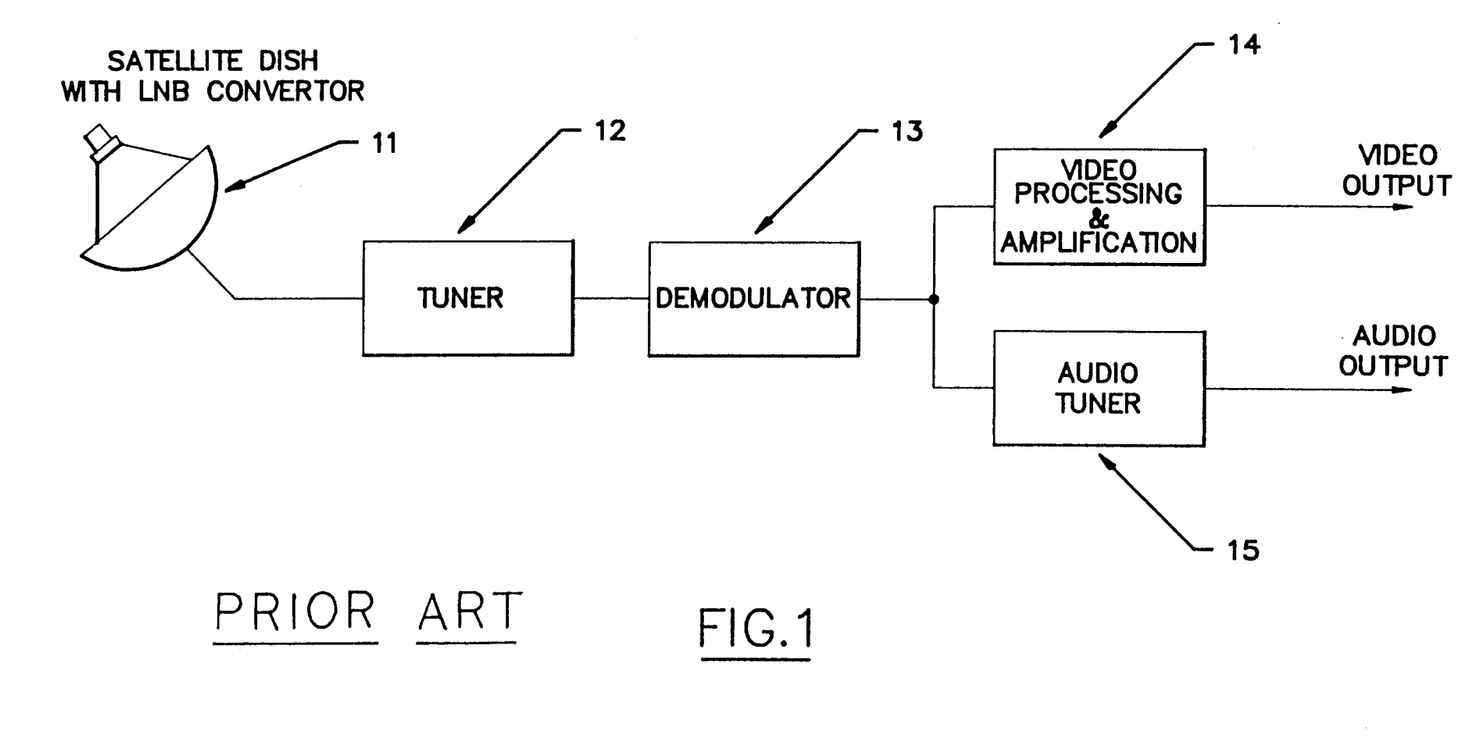
FIG. 1 is a simplified block diagram of a conventional TVRO earth station.

Referring now to the drawings, in FIG. 1 there is shown a functional block diagram of a TVRO earth station for the reception of satellite signals. The system includes an antenna 11, which is typically a paraboloidal dish equipped with a low noise block (LNB) converter and related accessories and positioning mechanisms, for capturing signals transmitted from orbiting satellites; and a receiver system including a tuner 12, a demodulator 13, a video processing and amplification section 14, and an audio tuner 15.

The antenna 11 receives signals transmitted from the satellite in the four-GHz frequency band (3.7 to 4.2 GHz); and this entire block of frequencies is converted to a 1st IF frequency range (typically 950 to 1450 MHz) by the block converter located at the antenna site. The 1st IF signals are then sent via coaxial cable to the tuner 12 which selects a particular channel for viewing and converts the signals in that particular channel to a 2nd IF frequency range. The 2nd IF frequency range is preferably high enough to permit the 2nd IF VCO frequencies to be above the 1st IF block of frequencies, to prevent the VCO output from interfering with the desired signals. For a 1st IF frequency range of 950 to 1450 MHz, this means that the center frequency of the second IF frequency range must be at least 480 MHz. A particularly preferred 2nd IF center frequency in the system of the present invention is 612 MHz.

In the demodulator 13, the 2nd IF signal is passed through an amplifier and a filter and on to a conventional video detector which demodulates the frequency-modulated signal to the baseband of the original video signal (e.g., 0 to 10 MHz), producing a composite video signal output. The filter preferably has a pass band that is only about 22 MHz wide; a pass band of this width passes the essential video and audio information while rejecting unwanted noise received by the antenna on the edges of the selected channel.

The output of the demodulator comprises the baseband signals which range from DC to about 8.5 MHz; this includes video information from about 15 KHz to 4.2 MHz, and subcarriers from about 4.5 to 8.5 MHz.

Figure 2:
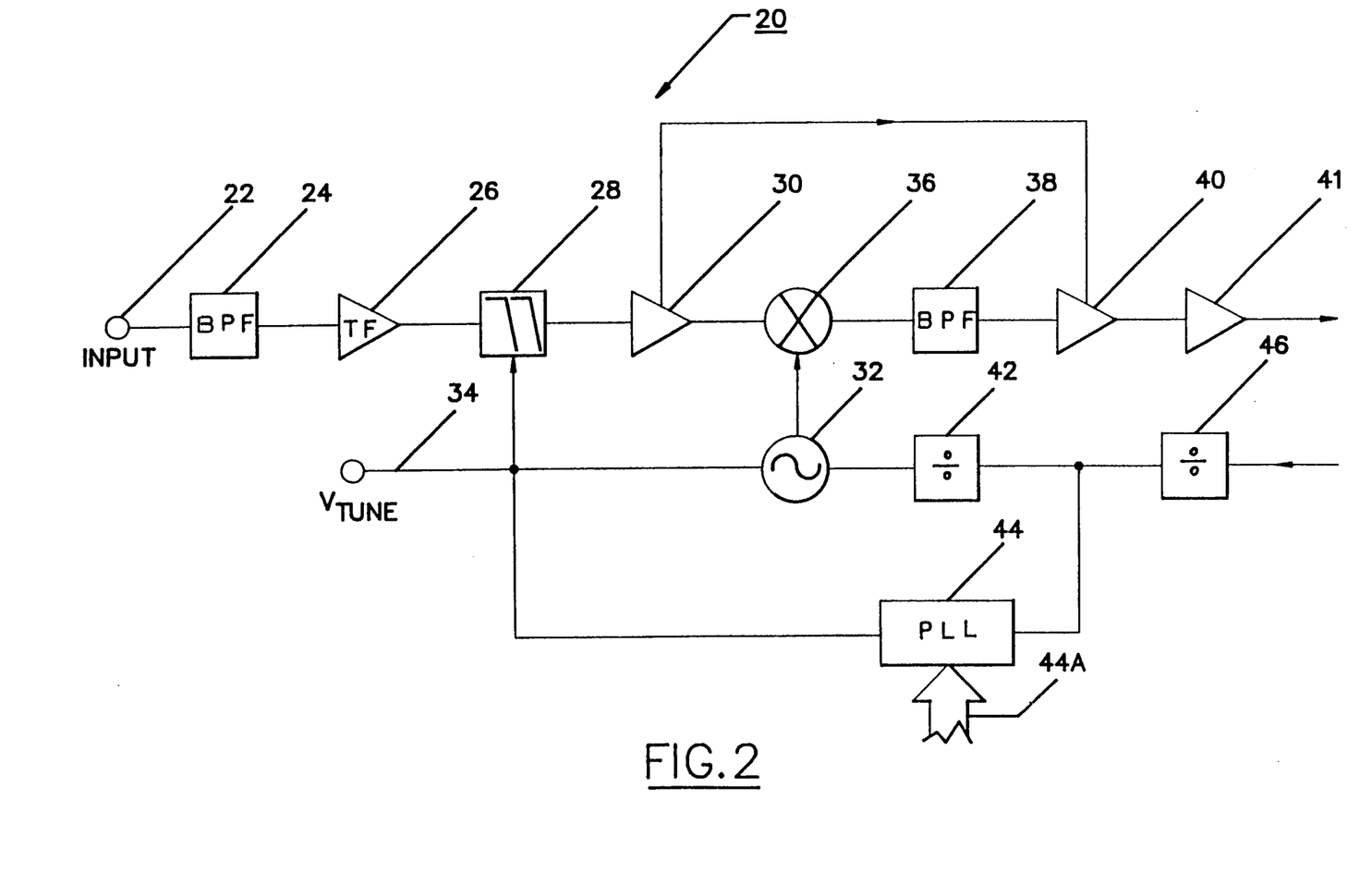
FIG. 2 is a block diagram of a tuner for use in the TVRO system of FIG. 1 and including the image frequency rejection filter of this invention.

Referring now to FIG. 2, there is shown a simplified block diagram of a suitable tuner stage 20 for use in the TVRO system of FIG. 1. This tuner 20 accepts the received satellite signals at its input point 22 and includes a passband filter 24 having a passband that is typically 500 megahertz wide so that it is capable of passing signals in the first IF range of 950 to 1450 megahertz. From the filter 24, the first IF signals are passed through an RF preamplifier 26 to an image frequency rejection tracking filter 28 which functions to reject image frequencies generated at the received frequencies. The operation of the tracking filter 28 will be discussed in detail below.

The signals passed by the tracking filter 28 are fed through an automatic gain control (AGC) amplifier 30 to a superheterodyne circuit include a voltage-controlled oscillator (VCO) 32 receiving a controlling input voltage $V_{TUNE}$ over a tune bus 34, and a mixer 36 for combining the output of the VCO 32 with the first IF output of amplifier 26 after it has been filtered by the tracking filter 28. The mixing stage converts the first IF signals to the desired second IF frequency range which in this case is centered at 612 megahertz. The resulting second IF signals are then passed through a bandpass filter stage 38 which serves to prevent passage of any stray signals beyond the second IF frequency range. Subsequently, the filtered IF signals undergo amplification by passage through an automatic gain control (AGC) amplifier 40 which is in feedback contact with the AGC amplifier 30 of the first IF stage. The amplifier 41 provides a final stage of amplification before the second IF signals pass out of the tuner stage and are fed to the demodulator.

The tune bus 34 which carries the tuning voltage $V_{TUNE}$ for the VCO 32 is also linked directly to the tracking filter 28 and maintains correspondence between the cutoff frequency of the tracking filter and the current VCO output frequency. Integrity of the output frequency of the voltage control oscillator 32 is ensured by a conventional feedback loop comprising a frequency divider 42 and a phase locked loop (PLL) 44 utilizing a standardized frequency source (not shown) which is regulated through a control bus 44a. A prescaled output is also available from the VCO loop through a second frequency divider 46.

The tuner shown at 20 essentially operates within the TVRO receiver system by adjusting the controlling input voltage supplied to the VCO 32, i.e., $V_{TUNE}$, via tune bus 34 in such a way that different channels (frequency bands) in the first IF signals are centered on the center frequency (612 MHz) of the second IF output of the mixer 36.

Each channel typically contains at least a video carrier signal, a color subcarrier signal, and an audio signal at different prescribed frequencies. These carrier and subcarrier signals for all the channels are transmitted simultaneously from the satellite to the earth station antenna 10 and block converter 11, and then over a cable to the tuner 12.

The following "Table I" is a list of the center frequencies for 24 transponders on a single satellite. Table I also lists the corresponding center frequencies in the output from the block converter 11 (identified in Table I as the 1st IF center frequencies) and the output frequencies required from the VCO 21 in order to tune the receiver to each individual transponder. It will be noted that the difference between the 1st IF center frequency and the corresponding VCO output frequency for each transponder is 612 MHz, which means that the center frequency of the 2nd IF output from the mixer 23 is 612 MHz for every transponder. That is, the VCO output frequencies listed in Table I will cause the 612-MHz output frequency of the mixer 23 to be centered on the corresponding 1st IF center frequency. For example, a VCO output frequency of 2042 MHz will cause the 612-MHz output frequency of the mixer to be centered on the 1430-MHz 1st IF center frequency of transponder No. 1.

TABLE I

| Transponder Number ("Channel") | Transponder Center Freq. | 1st IF Center Freq. | VCO Output Freq. | 2nd IF Center Freq. |
|---|---|---|---|---|
| 1 | 3720 MHz | 1430 MHz | 2042 MHz | 612 MHz |
| 2 | 3740 | 1410 | 2022 | 612 |
| 3 | 3760 | 1390 | 2002 | 612 |
| 4 | 3780 | 1370 | 1982 | 612 |
| 5 | 3800 | 1350 | 1962 | 612 |
| 6 | 3820 | 1330 | 1942 | 612 |
| 7 | 3840 | 1310 | 1922 | 612 |
| 8 | 3860 | 1290 | 1902 | 612 |
| 9 | 3880 | 1270 | 1882 | 612 |
| 10 | 3900 | 1250 | 1862 | 612 |
| 11 | 3920 | 1230 | 1842 | 612 |
| 12 | 3940 | 1210 | 1822 | 612 |
| 13 | 3960 | 1190 | 1802 | 612 |
| 14 | 3980 | 1170 | 1782 | 612 |
| 15 | 4000 | 1150 | 1762 | 612 |
| 16 | 4020 | 1130 | 1742 | 612 |
| 17 | 4040 | 1110 | 1722 | 612 |
| 18 | 4060 | 1090 | 1702 | 612 |
| 19 | 4080 | 1070 | 1682 | 612 |
| 20 | 4100 | 1050 | 1662 | 612 |
| 21 | 4120 | 1030 | 1642 | 612 |
| 22 | 4140 | 1010 | 1622 | 612 |
| 23 | 4160 | 990 | 1602 | 612 |
| 24 | 4180 | 970 | 1582 | 612 |

Figure 3:
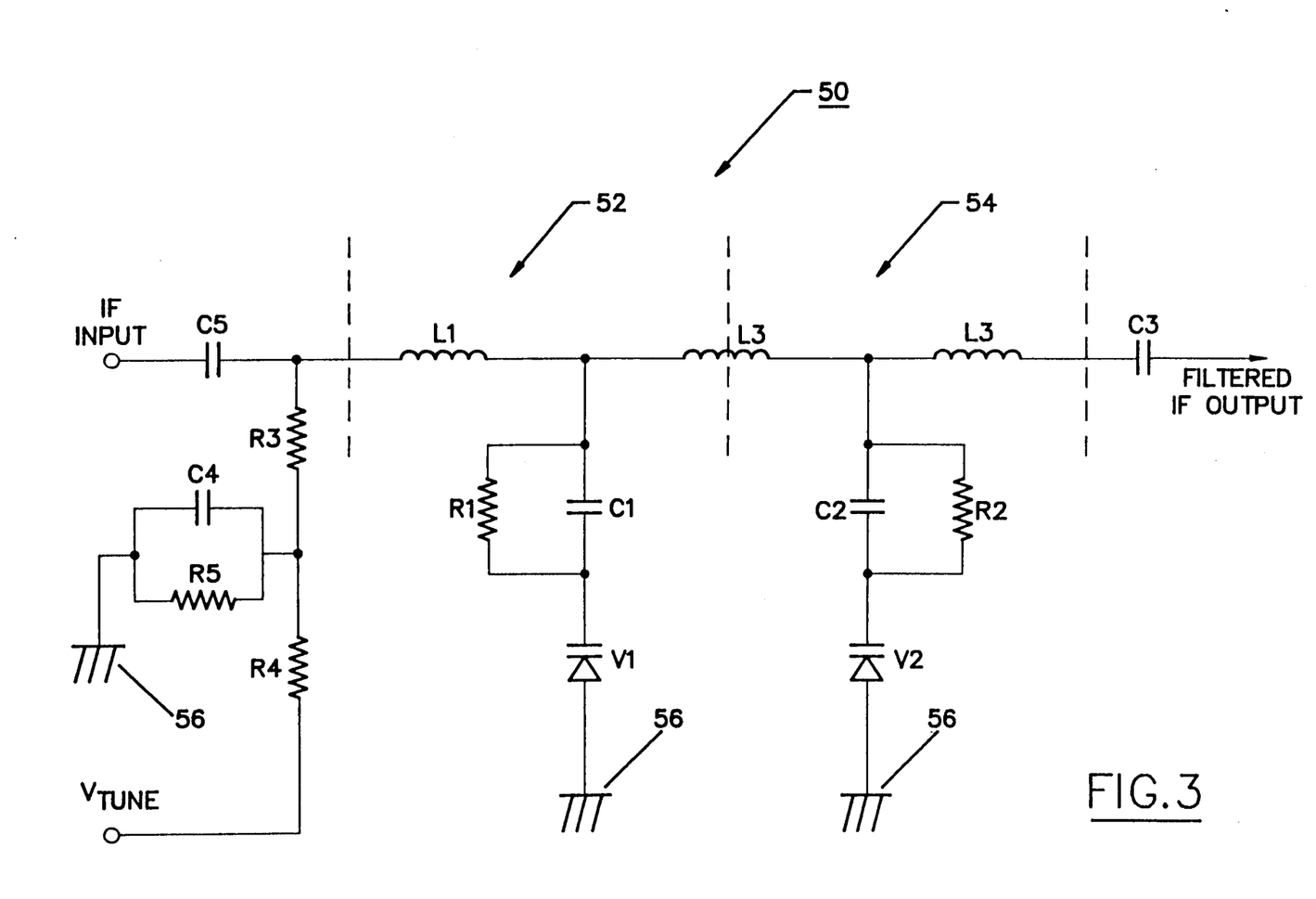
FIG. 3 is a schematic diagram of an exemplary image frequency rejection filter for use in the TVRO system of FIGS. 1 and 2.

Referring now to FIG. 3, there is shown a schematic diagram of an exemplary tracking filter 50 in accordance with the system of this invention. The filter 50 essentially comprises a cascade connection of a first T-section filter 52 and a second T-section filter 54 connected in parallel across the input line and a reference ground plane 56. Each T-section constitutes a low-pass filter of the series-L shunt-C type and has a cutoff frequency which can be electronically controlled by the use of voltage-controlled variable-reactanc devices. More specifically, variable reactance or varactor diodes are used within each of the T-sections to regulate the respective cutoff or roll-off frequencies electrically. Thus, the first T-section 52 comprises a series inductances $L_1$–$L_3$ and a shunt capacitance $C_1$ serially connected to varactor diode $V_1$. A bypass current path is provided in the capacitance arm of the T-section filter by the connection of a resistance $R_1$ across the capacitance $C_1$. The received signals, i.e., the block of 1st IF signals are supplied as input to the tracking filter 50 through a DC blocking capacitor $C_5$. The varactor diode $V_1$ is disposed within the T-section 52 with its anode connected to the junction of resistance $R_1$ and capacitance $C_1$ and the cathode end connected to the ground plane 56.

The second T-section 54 of the tracking filter is identical to the first section. More specifically, the inductance $L_3$ connects the two sections and also functions as the input radio-frequency choke for the second section which includes series inductance $L_2$ and a parallel capacitance $C_2$ connected in series with a varactor diode $V_2$. The varactor $V_2$ is connected between the capacitance $C_2$ and ground with its anode end connected to the capacitance $C_2$. A resistance $R_2$ connected in cascade across capacitance $C_2$ provides the current bypass path in the capacitance arm of the T-section. The filtered output of the tracking filter 50 is taken from a second DC blocking capacitance $C_3$.

The tuning voltage for the tracking low-pass filter is supplied to the radio-frequency choke $L_1$ through a serial connection of a bias feed resistor $R_3$ and a fixed voltage divider circuit comprising a serial resistor $R_4$ feeding the tuning voltage to the bias feed resistor $R_3$ and a shunt connection of capacitance $C_4$ and resistance $R_5$ connecting the junction of resistances $R_3$ and $R_4$ to the ground plane 56. The capacitance $C_4$ serves as a bypass path for preventing received radio frequency signals from being fed down the line.

Figure 4:
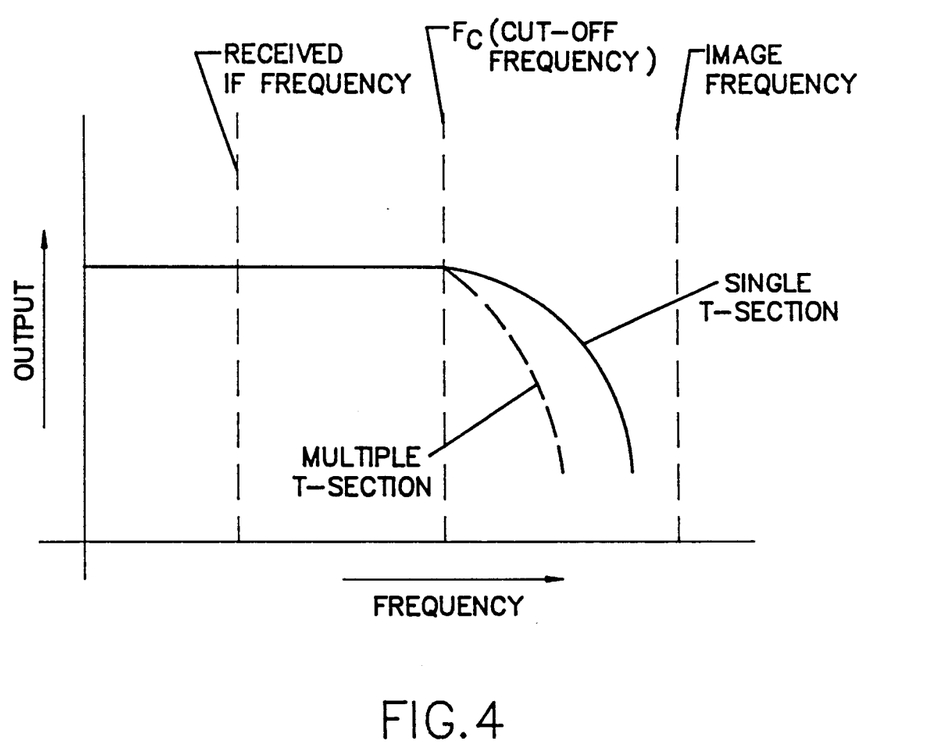
FIG. 4 is a representation of the ideal response characteristic of the tracking filter according to this invention.

The operation of each of the T-section filters 52 and 54 is identical and corresponds to the frequency response characteristics shown in FIG. 4. As clearly shown therein, output signals which fall within the flat passband section of the filter, i.e., signals at a frequency less than the critical or roll-off frequency $F_c$ are passed without any attenuation. Signals possessing a frequency greater than $F_c$ come within the downwardly sloping "skirt" section of the response characteristics and are increasingly attenuated. At the higher frequencies of operation, the inductive reactance of each T-section remains constant and as the tuning voltage $V_{TUNE}$ is varied, the reverse bias applied to the varactor diode in the T-section changes. The capacitance offered by the varactor diodes $V_1$ and $V_2$ correspondingly changes as a function of the applied tuning voltage.

The varactor diode normally conducts in the forward direction, but the reverse current saturates at a relatively low voltage and then remains constant, eventually rising rapidly at the avalanche point. As is well known, the operating region of interest for varactor diodes in filtering operations lies between the reverse saturation point, at which the junction capacitance of the diode is a maximum, and a point just about avalanche, at which diode capacitance is at a minimum. As a result, the range of capacitance variation available from the varactor is defined by the conditions limiting the reverse voltage swing, i.e., conduction and avalanche. The varactor diodes are ideally chosen to have a large capacitance variation and a small value of minimum junction capacitance; in addition it is ensured that the base resistance of the diode is at a minimum in order to minimize noise. Consequently, as the tuning voltage applied to the T-section through inductance $L_1$ is increased, the varactor diod $V_1$ becomes less capacitive and as a result increases the roll-off frequency value $F_c$. The second T-section 54 also functions in a similar manner and the cascade connection of the two sections provides better rejection of image frequencies which is closer to the cut-off point.

According to a feature of this invention, the same tuning voltage used to regulate the output frequencies of the voltage control oscillator in the local oscillator stage of the tuner (VCO 32 in FIG. 2) is fed as the tuning voltage to the tracking filter. Since each T-section of the tracking filter is designed to have a cut-off frequency about the VCO output frequency, for a particular tuning voltage $V_{TUNE}$, the frequency of received first IF signals which correspond to the VCO output frequency fall within the passband of the low-pass filter. The image frequencies corresponding to the received first IF frequencies fall beyond the roll-off frequency $F_c$ and are rejected.

As an example, consider the case where the selected second IF frequency is 612 MHz and a signal corresponding to a first IF output frequency of 818 MHz is being received. The tuning voltage $V_{TUNE}$ supplied to the oscillator is regulated so as to produce an oscillator output frequency equal to the sum of the desired signal frequency and the selected IF frequency, i.e., the sum of 818 MHz and 612 MHz, which is equal to 1430 MHz. Since the same tuning voltage $V_{TUNE}$ is also fed to the tracking filter 50 in FIG. 3, the cutoff or roll-off frequency $F_c$ is ideally set to correspond to the VCO output frequency i.e., 1430 MHz. The received signal frequency of 818 MHz falls Well within the passband of the tracking low-pass filter and is consequently passed through the filter with insignificant insertion loss or attenuation.

The image frequency corresponding to a received signal frequency is equal to the sum of the received signal frequency and twice the selected second IF frequency or alternatively equal to the sum of the selected second IF frequency and the instant VCO output frequency. In the example considered above, the image frequency corresponding to the received signal frequency of 818 MHz and the second IF frequency 612 MHz is produced at 2042 MHz. It is apparent that this image frequency falls substantially beyond the roll-off frequency $F_c$ and is consequently attenuated severely or rejected completely. The cascade connection of the two T-sections 52 and 54 merely supplements the discrimination action provided by a single T-section and results in enhanced rejection of frequencies falling about the skirt of the response characteristic of the filter.

If a conventional bandpass filter were to be used in such a situation, the center frequency of the filter passband would have to be tuned in such a way that the filter would have a peak response at the desired received signal frequency (818 MHz in the above example). If a wide band FM signal is to be passed at the desired received signal frequency, as is commonly the case in satellite signals broadcast via transponders, any deviation in the peak response of the filter has a significant impact; as a result, attenuation of a portion of the modulation bandwidth can occur. The only way to achieve adequate frequency rejection by using a bandpass filter is to ensure accurate tracking of the bandpass filter by accurately matching and tuning the varactor diodes used to define the limits of the filter passband.

The use of the low-pass filtering action of the tracking filter, according to this invention, provides effective rejection of undesired image frequencies without requiring accurate tuning or tracking of the filter. More specifically it is not critical that the filter be tuned to a cut-off frequency which corresponds exactly to the received signal frequency. In the example discussed above, for instance, the filter could be very loosely tuned so that the roll-off frequency $F_c$ could be up to a few hundred megahertz off the received signal frequency. In spite of this offset tuning, there is very little effect on the rejection of the corresponding image frequencies which fall substantially beyond the roll-off frequency $F_c$ and are effectively attenuated despite the change in passband produced as a result of the loose tuning of the filter. It should be noted that the practical frequency response of the series-L shunt-C, type of low-pass filters shown in FIG. 3 shows that certain frequencies beyond the cut-off frequency $F_c$ are not completely rejected. However, these filters operate effectively in rejecting image frequencies which almost always fall somewhere along the skirt of the frequency response, since rejection provided in this skirt area is adequate for TVRO receiver applications.

In effect, the tracking filter functions by having its rejection frequency varied by the tuning voltage $V_{TUNE}$ in correspondence with the output frequency of the VCO, and consequently the frequency of received signals. For any given frequency of received signals, the frequency characteristic of the tracking filter is maintained in such a way that a flat response is elicited from the filter up to the corresponding VCO output frequency, so that all image frequencies, which are necessarily substantially greater than the VCO output frequency, are effectively rejected. Since it is not necessary for the filter to be tuned exactly to a selected cutoff frequency $F_c$, there is no corresponding need for matched varactor diodes. The passband of the filter and the rejection of image frequencies is just as effective when the received signals have a substantially large band width. In addition, the provision of multiple T-sections allows a given amount of frequency rejection to be achieved while utilizing a more relaxed tuning of the filter; this is possible because the additional T-sections effectively increase the slope of the skirt in the filter frequency response characteristic (see the dashed line in FIG. 4.).

Although the various components comprising the low-pass tracking filter according to this invention are shown to be in the form of discrete components (FIG. 3), it is possible to implement the tracking filter in the form of a printed circuit or hybrid circuit using strip lines and printed chokes. Further, other types of low-pass filter sections may be used just as effectively provided the sections include a capacitive reactance which can be varied in correspondence with the tuning voltage $V_{TUNE}$ used to regulate the VCO output frequency in the TVRO tuner.

We claim:

1. A TVRO receiver for receiving frequency modulated video signals while rejecting image frequencies generated at received signal frequencies, the receiver comprising
   a tuner including a super heterodyne circuit having a voltage-controlled oscillator (VCO), means for supplying a first controlling variable tuning voltage to said VCO, and a mixer for combining incoming 1st IF signals with the output frequency of said VCO to reduce the frequency of the 1st IF signals to a selected 2nd IF frequency;
   a tracking filter upstream of said mixer and having a cut-off frequency controllable by application of a controlling tuning voltage thereto for passing only said incoming 1st IF signals while rejecting any image frequency signals generated from said incoming signals; and
   means for supplying a second controlling variable tuning voltage to said tracking filter for adjusting said cut-off frequency to have a value higher than the incoming 1st IF signals but less than that of the image frequencies.

2. The TVRO receiving of claim 1 wherein the 2nd IF frequency is sufficiently high to permit the output frequency of said VCO to be above the frequency range of the 1st IF signals.

3. The TVRO receiver of claim 2 wherein image frequencies are generated at frequencies equal to the sum of a current VCO output frequency and the selected 2nd IF frequency, and the tracking filter is a low-pass filter having a cut-off frequency which is higher than the incoming 1st IF signals frequencies but lower than the image frequencies corresponding to these 1st IF signal frequencies.

4. The TVRO receiver of claim 3 wherein said first controlling tuning voltage to said VCO is also supplied as the second tuning voltage to said tracking filter.

5. The TVRO receiver of claim 4 wherein the tracking filter comprises at least one T-section series L shunt-C filter, each T-section filter including first and second series inductances $L_1$ and $L_2$, and a series connection of a capacitance $C_1$ and a varactor diode $V_1$ connected in parallel across the junction of inductances $L_1$ and $L_2$ and a ground plane, the anode end of $V_1$ being connected to capacitance $C_1$, and the cathode end of $V_1$ being connected to the ground plane.

6. The TVRO receiver of claim 5 wherein the filter tuning voltage to the filter is applied to inductance $L_1$ through a bias feed resistance $R_3$ and a voltage divider network comprising a resistance $R_4$ connecting the tuning voltage to bias resistance $R_3$, and a resistance $R_5$ connecting the junction of resistances $R_4$ and $R_3$ to the ground plane.

7. The TVRO receiver of claim 6 wherein the incoming 1st IF signals are fed to said first inductance $L_1$ of the tracking filter through a first DC blocking capacitance $C_5$, the resulting filtered output is extracted from the second series inductance $L_2$ through a second blocking capacitance $C_3$, and an RF bypass path is provided through a bypass capacitance $C_4$ between the junction of the bias resistance $R_3$ and divider resistance $R_4$.

8. The TVRO receiver of claim 7 wherein the tracking filter comprises a cascade connection of two T-section low-pass filters.

9. The TVRO receiver of claim 1 wherein said 1st IF signals have a frequency of 950 to 1450 MHz and said second IF signals have a center frequency of at least 450 MHz.

10. In a TVRO receiver for receiving frequency modulated satellite signals while rejecting any image frequencies generated therefrom, the receiver comprising a tuner including a super heterodyne circuit having a voltage-controlled oscillator (VCO) with an output frequency controllable by a variable tuning voltage $V_{TUNE}$ and means for applying the tuning voltage to said VCO, and a mixer for combining incoming 1st IF signals with the output of said VCO to reduce the frequency of the 1st IF signals to a selected 2nd IF frequency,
   the improvement comprising a tracking filter upstream of said mixer and adapted to pass only said incoming 1st IF signals and reject any image frequency signals generated from said incoming signals at frequencies exceeding said VCO output frequency, said filter comprising at least one low-pass filter section and having an adjustable cut-off frequency, said cut-off frequency being adjusted to correspond to said VCO output frequency by applying said variable VCO tuning voltage $V_{TUNE}$ to said filter so that frequencies exceeding the VCO output frequency are rejected by said filter.

11. The improved TVRO receiver of claim 10 wherein the tracking filter comprises at least one T-section low-pass filter section in the form of a series-L shunt-C section, said filter section including a variable capacitance diode responsive to the tuning voltage supplied to the filter for varying the cut-off frequency of that filter.

12. The improved TVRO receiver of claim 11 wherein said 1st IF signals have a frequency of 950 to 1450 MHz and said 2nd IF signal frequency is sufficiently high to permit the output frequency of said VCO to be above the frequency range of the 1st IF signals.

13. The improved TVRO receiver of claim 11 wherein the 2nd IF signals have a center frequency of at least 480 MHz.

14. A TVRO receiver for receiving frequency modulated video signals while rejecting image frequencies generated at received signal frequencies, the receiver comprising
   a tuner including a super heterodyne circuit having a voltage-controlled oscillator (VCO), means for supplying a first controlling tuning voltage to said VCO, and a mixer for combining incoming 1st IF signals with the output frequency of said VCO to reduce the frequency of the 1st IF signals to a selected 2nd IF frequency;
   a low-pass tracking filter having a controllable cut-off frequency for passing only said incoming 1st IF signals while rejecting any image frequencies generated therefrom, said image frequencies being generated at frequencies equal to the sum of a current VCO output frequency and the selected 2nd IF frequency, said tracking filter having a cut-off frequency which is higher than the incoming 1st IF signal frequencies but lower than the image frequencies corresponding to these 1st IF signal frequencies; and means for supplying a second controlling tuning voltage to said tracking filter for adjusting said cut-off frequency to have a value less than that of said image frequencies.

15. The TVRO receiver of claim 14 wherein the controlling tuning voltage to said VCO is also supplied as the tuning voltage to said tracking filter.

16. The TVRO receiver of claim 14 wherein the tracking filter comprises a cascade connection of two T-section low-pass filters.

17. The TVRO receiver of claim 14 wherein said 1st IF signals have a frequency of 950 to 1450 MHz and said second IF signals have a center frequency of at least 450 MHz.

* * * * *